(12) United States Patent
Steinberg et al.

(10) Patent No.: US 12,531,521 B2
(45) Date of Patent: Jan. 20, 2026

(54) SOUND QUALITY ENHANCEMENT SYSTEM AND DEVICE

(71) Applicants: Nevin Steinberg, New York, NY (US); Andrew Funk, Brooklyn, NY (US); Jason Crystal, New York, NY (US)

(72) Inventors: Nevin Steinberg, New York, NY (US); Andrew Funk, Brooklyn, NY (US); Jason Crystal, New York, NY (US)

( * ) Notice: Subject to any disclaimer, the term of this patent is extended or adjusted under 35 U.S.C. 154(b) by 0 days.

(21) Appl. No.: 18/496,448

(22) Filed: Oct. 27, 2023

(65) Prior Publication Data

US 2024/0063762 A1 Feb. 22, 2024

Related U.S. Application Data

(63) Continuation of application No. 16/287,861, filed on Feb. 27, 2019, now Pat. No. 11,804,808.

(51) Int. Cl.
*H03F 3/185* (2006.01)
*H03G 3/32* (2006.01)
*H03G 9/00* (2006.01)
*H04R 29/00* (2006.01)

(52) U.S. Cl.
CPC ............... *H03F 3/185* (2013.01); *H03G 3/32* (2013.01); *H03G 9/005* (2013.01); *H04R 29/007* (2013.01)

(58) Field of Classification Search
CPC .......... H03F 3/185; H03G 3/32; H03G 9/005; H04R 29/007
See application file for complete search history.

(56) References Cited

U.S. PATENT DOCUMENTS

| | | | | |
|---|---|---|---|---|
| 4,057,790 A * | 11/1977 | Fleming | ............... | G08B 25/016 340/7.49 |
| 4,395,600 A * | 7/1983 | Lundy | ....................... | H03G 3/32 381/73.1 |
| 4,617,536 A * | 10/1986 | Richard | ............... | H04R 25/353 381/314 |
| 4,837,832 A * | 6/1989 | Fanshel | ................ | H04R 25/502 381/317 |
| 4,899,387 A * | 2/1990 | Pass | .................. | G10K 11/17857 381/71.7 |
| 5,838,807 A * | 11/1998 | Andersson | ........... | H04R 25/356 381/106 |
| 6,061,456 A * | 5/2000 | Andrea | .................... | H04M 9/08 381/71.7 |
| 7,408,390 B2 * | 8/2008 | Yamada | ............... | H03F 3/45192 327/124 |
| 7,555,130 B2 * | 6/2009 | Klayman | ................. | H04S 1/002 381/1 |
| 7,778,427 B2 * | 8/2010 | Klayman | ............... | H03G 5/165 381/1 |
| 8,358,788 B2 * | 1/2013 | Heyl | .................... | H03F 3/45475 330/69 |
| 10,305,429 B2 * | 5/2019 | Choo | ........................ | H03F 3/68 |
| 2004/0036531 A1 * | 2/2004 | Trevelyan | ............. | H03F 3/2173 330/10 |

(Continued)

*Primary Examiner* — Oyesola C Ojo
(74) *Attorney, Agent, or Firm* — Bochner PLLC

(57) ABSTRACT

An exemplary audio enhancement system substantially eliminates latency by returning audio input signals in amplified form directly in the analog domain to the source, thereby reducing signal degradation and removing redundancy from digital and analog audio transmission and processing architectures.

19 Claims, 12 Drawing Sheets

(56) References Cited

U.S. PATENT DOCUMENTS

| | | | |
|---|---|---|---|
| 2006/0062395 A1* | 3/2006 | Klayman | H03G 5/025 |
| | | | 381/1 |
| 2010/0104313 A1* | 4/2010 | Kosaka | G03G 15/1675 |
| | | | 399/88 |
| 2010/0202635 A1* | 8/2010 | Doy | H03F 3/005 |
| | | | 381/309 |
| 2011/0033056 A1* | 2/2011 | Johnson | H03F 3/68 |
| | | | 381/58 |
| 2012/0121106 A1* | 5/2012 | Henriksen | H04R 3/06 |
| | | | 381/94.1 |
| 2013/0259266 A1* | 10/2013 | Yayama | H03F 1/0211 |
| | | | 381/120 |
| 2014/0050335 A1* | 2/2014 | Moronvalle | H03F 1/301 |
| | | | 381/120 |
| 2014/0064519 A1* | 3/2014 | Silfvast | G10H 1/18 |
| | | | 381/119 |
| 2014/0093103 A1* | 4/2014 | Breece, III | H03F 1/26 |
| | | | 381/120 |
| 2015/0228262 A1* | 8/2015 | Silfvast | G10H 1/18 |
| | | | 381/119 |
| 2015/0256613 A1* | 9/2015 | Walker | H04L 43/10 |
| | | | 709/217 |
| 2016/0100243 A1* | 4/2016 | Wismar | H03F 3/187 |
| | | | 381/74 |
| 2016/0328501 A1* | 11/2016 | Chase | G06F 30/367 |
| 2016/0344359 A1* | 11/2016 | MacDonald | H03G 3/001 |
| 2017/0068513 A1* | 3/2017 | Stasior | G06F 3/0604 |
| 2019/0356287 A1* | 11/2019 | Lesso | H04R 29/001 |
| 2020/0389342 A1* | 12/2020 | Belitzer | H04L 25/0282 |

* cited by examiner

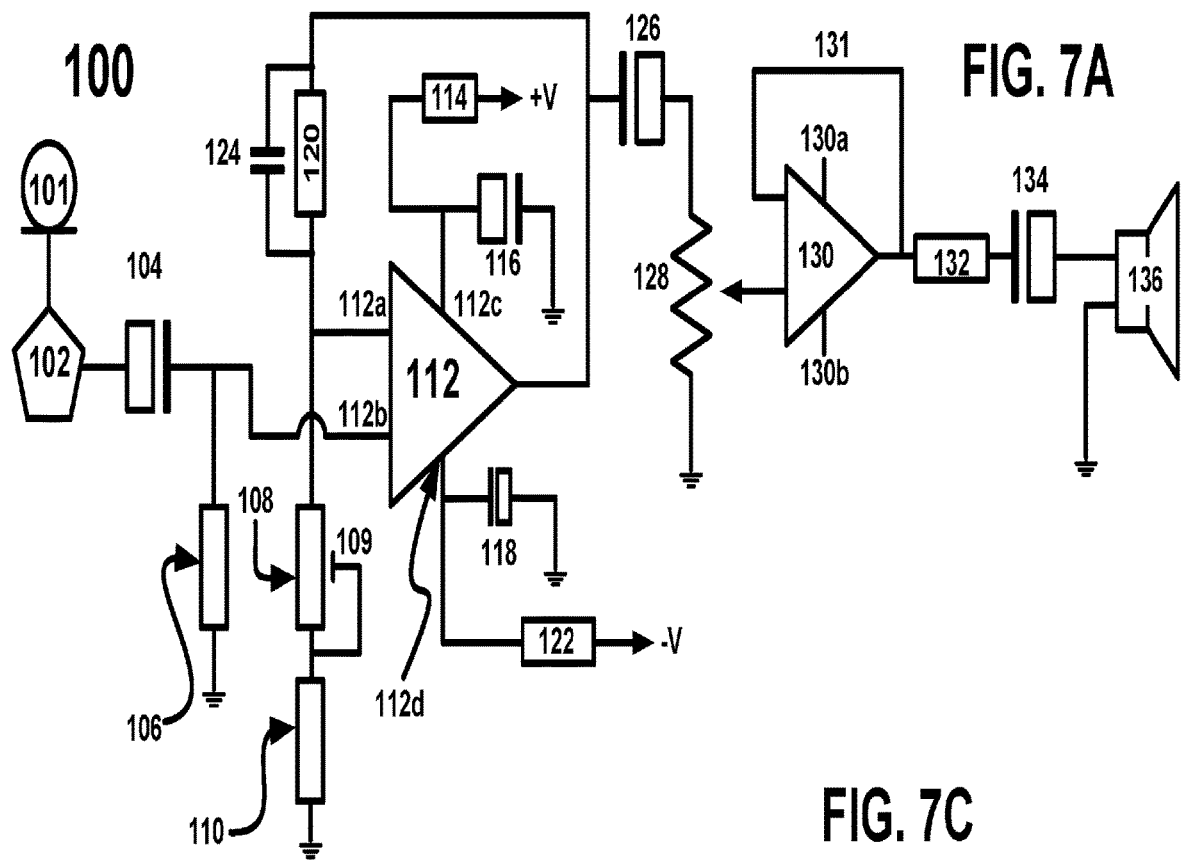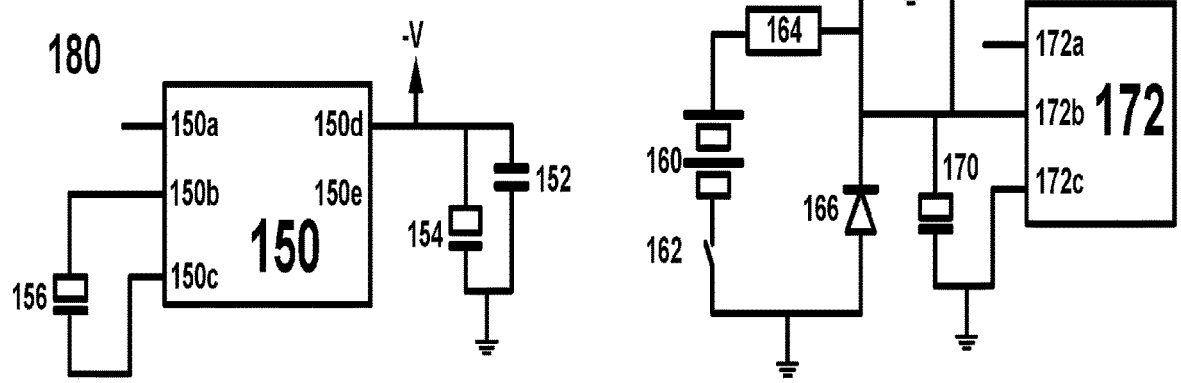

SOUND QUALITY ENHANCEMENT SYSTEM AND DEVICE

This application is a continuation of U.S. patent application Ser. No. 16/287,861, filed on Feb. 27, 2019, now U.S. Pat. No. 11,804,808, the entire disclosures of which being incorporated herein by reference in their entirety.

FIELD OF THE INVENTION

This invention relates to systems that enhance sound quality and reception of audio signals while the sound is being received and communicated.

BACKGROUND OF THE INVENTION

In a typical audio signal flow, the mobile performer uses a wireless microphone transmitter whose receiver output is processed by a monitor system and returned to the performer by means of loudspeakers or wireless personal monitoring systems such as in-ear monitors (IEM's). This allows the performer to hear themselves relative to other sounds (music, audience, room, etc.). Typical microphones used may be cardioid (unidirectional) or omnidirectional. Challenges to any such monitoring system may include: (i) system throughput latency (as discussed in Lester and Boley article entitled "The Effects of Latency on Live Sound Monitoring," Audio Engineering Society Convention paper (Oct. 5-8, 2007, New York, NY)); (ii) signal degradation (electronic, acoustic); (iii) gain before feedback; (iv) monitoring equipment complexity and reliability; (v) monitoring equipment expense; and/or (vi) monitor engineer training, consistency and expense.

In typical wearable sound systems, the user will have an audio reception device, such as, for example, a microphone, into which a sound is communicated. The signals representative of the sound are carried electronically through a transmission device. The transmitter will typically be connected either via wireless or wired means to a sound processing device, such as a sound board or post-processing system, where it is communicated back to an audio projection device, such as, for example, an earphone.

A byproduct of using the aforementioned sound systems is one or more of the following: reduction in vocal accuracy (e.g., pitch, and rhythm), vocal strain (e.g., oversinging), latency/delay between reception of sound and communication of sound to the user, feedback and other forms of noise/audio pollution, and increased number of products and intermediaries (e.g., personnel or equipment) needed to coordinate in the system.

Those of ordinary skill in the art would be familiar with the concept of latency, examples of which may be shown and described in the Lester and Boley article entitled "The Effects of Latency on Live Sound Monitoring," Audio Engineering Society Convention paper (Oct. 5-8, 2007, New York, NY), which is incorporated herein by reference in its entirety. Prior attempts to rectify the issue of latency in sound monitoring have proven ineffective, are cost-inefficient, and unable to solve the problem.

Referring to the illustrative embodiment of FIG. 1, an audio source 1, which may be a performer or other sound generator, utilizes a sound input mechanism known to those skilled in the art, such as, for example, a microphone 3. According to this illustrative embodiment, a transmitter 4 is interconnected with microphone 3. Where the system of FIG. 1 is utilized in theatrical applications, transmitter 4 may be worn on the body of performer 1 (such as, for example, a wireless device). Transmitter 4 may broadcast the signals from source 1 to a receiver 5, which may be tuned to the transmitter 4 frequency. A monitoring entity 2, which may be a monitor engineer, may operate an analog monitor sound console 6 to generate a desired audio output using the signal from receiver 5. From analog monitor sound console 6 a signal may be sent to an audio output device 9, which may be speakers or surround-sound systems, for example.

In operation, a system exemplified by FIG. 1 may provide a complete analog signal flow, which results in negligible latency from microphone 3 to output 9, however, use of speakers (such as audio output 9) in close proximity to microphone 3 will create feedback loop if the audio source 1 desires to hear their sound through output 9. For example, in theatrical applications, a performer may desire to hear him or herself via monitor speakers. Another aspect of the system exemplified by FIG. 1 is the need for a controller/monitor 2 separate and apart from source 1, which is required in the post processing of output sound signals from source 1. A consequence of use of a system according to FIG. 1 is that the sound mix and volume will fluctuate as source 1 moves toward or away from output 9 and/or output 9 moves to and from source 1.

According to the exemplary embodiment of FIG. 1, an analog signal path may keep latency in the system to approximately zero time (e.g., 1-2 microseconds), although there may be latency in acoustic time measured from the distance of the sound transmission means 9 to the source 1.

In practice, the proximity of the sound transmission means 9 to the sound transmission means 1 limits the effectiveness of the FIG. 1 system configuration due to a potential feedback loop of the amplified sound signal returning to the sound transmission means 1. Further, the monitor/controller 2 must be engaged in dynamic adjustment of the sound signal, which increases system participants and injects potentials for processing and other delays.

Referring to the illustrative embodiment of FIG. 2, the source 1 may still utilize a sound transmission mechanism 3 to send sound to a transmitter 4. As in a system exemplified by FIG. 1, a transmitter 4 may transmit the sound signal to receiver 5, which thereafter receives post-processing by a monitor/controller 2 via analog monitor sound console 6. However, in the exemplary embodiment of FIG. 2, a monitor transmitter 7 may broadcast the post-processed sound signal from analog monitor sound console 6 back to a receiver 8, which like transmitter 4, may be worn on the source 1. An exemplary monitor transmitter 7 may be an in-ear monitor (IEM), which may be an earphone transducer connected to a wireless beltpack receiver designed to deliver audio information to the wearer. The transmitted, post-processed sound received at receiver 8 may then be delivered to source 1 via sound transmission means 10, which may include, earphones, headsets, speakers, or other audio transmission mechanisms known to those skilled in the art.

In operation, a system exemplified by FIG. 2 may provide a complete analog signal flow, which results in negligible latency from microphone 3 to receiver 8, however, the system of FIG. 2 must rely on the monitor/controller 2 separate and apart from source 1 and analog monitor sound console 6 for any corrective action on the audio signal. While the system exemplified by FIG. 2 may provide an analog, low-latency signal path in which feedback and acoustic latency are obviated by the elimination of the loudspeaker monitoring, it still requires monitor console equipment 6 and an monitor/controller 2 to operate, incurring additional costs and potential variability in sound processing.

Referring to the illustrative embodiment of FIG. 3, a source 1 may still utilize a sound input mechanism 3 to send sound to a transmitter 4 and require post-processing before the signal from source 1 returns via a sound transmission means 10. In contrast to a system exemplified by FIG. 2, a system illustrated via FIG. 3 incorporates a digital monitor sound console 6A to handle post-processing of signals from source 1. Consequently, a system illustrated by FIG. 3 will introduce levels of latency into the sound signal, which in certain cases may be between approximately 1.8 to approximately 3.0 ms of delay. As in the systems illustrated by FIGS. 1 and 2, the exemplary system of FIG. 3 also requires a monitor/controller 2 separate and apart from source 1 to correct the sound signal.

The system exemplified by FIG. 3 reflects the state of the art in audio processing architectures for use in performances in which most audio consoles in current use (including those used for monitoring) are digital. Introduction of digital components into the architecture come with the cost of added throughput latency to the monitoring system due to digital signal routing and processing. The sound source 1, such as a performer, will begin to notice the effects of time delay through the system as the audio returns to their ear. Expected latency varies with equipment but can range from 1.8 ms to 3.0 ms and increases with the introduction of additional sound processing, either within the monitor console infrastructure or outboard signal processing equipment. As in the analog system configurations exemplified by FIGS. 1 and 2, the system configuration exemplified by FIG. 3 will also still typically require monitor console equipment 6 and an independent monitor/controller 2.

Referring to the illustrative embodiment of FIG. 4, a source 1 may still utilize a sound input mechanism 3 to send sound to a digital transmitter 4A, which broadcasts a digital wireless signal to receiver 5A. As in FIG. 3, the processed digital wireless signal at receiver 5A receives post-processing at digital monitor sound console 6A and monitor/controller 2 before the signal from source 1 returns via a sound transmission means 10. In contrast to a system exemplified by FIG. 2, a system exemplified by FIG. 4 introduces latency via the digital console 6A and transmitter 4A, which may be in certain cases between approximately 4.8 to approximately 6.0 ms of delay. As in the systems of FIGS. 1, 2, and 3, the system of FIG. 4 also requires a monitor/controller 2 separate and apart from source 1 to correct the sound signal.

The system exemplified by FIG. 4 provides for a common substitution of a digital wireless microphone system, which can introduce additional throughput latency in the monitoring system (resulting in 4.8 ms to 6.0 ms). For theatrical applications, throughput latency in the aforementioned range may be deemed unusable for the performers. As a further detriment to the system, an added digital monitor console 6A may further increase the latency time through the system and further disrupt and/or undermine the reliability of this monitoring solution. As was the case before, this exemplary system configuration as illustrated in FIG. 4 still typically requires monitor console equipment and an independent monitor/controller to operate.

Referring to the illustrative embodiment of FIG. 5, a source 1 may still utilize a sound input mechanism 3 to send sound to a digital transmitter 4A, which broadcasts a digital wireless signal to receiver 5A. As in FIG. 3, the processed digital wireless signal at receiver 5A receives post-processing at digital monitor sound console 6A and monitor/controller 2. Before returning to source 1 via a sound transmission means 10, the sound signal is broadcast back through monitor 7 to a digital IEM receiver 8A at which point the IEM process the digitally post-processed signal prior to presentation to source 1 via means 10. In contrast to a system exemplified by FIG. 2, a system exemplified by FIG. 4 introduces latency via the digital console 6A and digital components (transmitter and receiver) 4A and 5A, and 7 and 8A, which may be in certain cases between approximately 5.8 to approximately 7.4 ms of delay. As in the systems of FIGS. 1, 2, 3, and 4, the system of FIG. 4 also requires a monitor/controller 2 separate and apart from source 1 to correct the sound signal.

Again, the exemplary system illustrated in FIG. 5 may include the introduction of additional digital wireless in-ear monitoring, which comes at a cost of additional throughput latency resulting in 5.7 ms to 7.4 ms. For theatrical applications, this range of latency is unacceptably high for a performer. As is the case in all prior art sound equipment systems, a monitor/controller 2 separate and apart from source 1 is required.

Consequently, the systems exemplified by FIGS. 1 through 5 suffer from numerous deficiencies in terms of latency, increased resource utilization and/or additional controllers/monitors of the sound signal of the source, and/or redundancy in signal transmission components.

SUMMARY OF THE INVENTION

An audio enhancement system, comprises a microphone and a communication device for communicating the sound received at the microphone. An enhancement circuit coupling the microphone to the communication device may have a DC power source and a plurality of amplifiers in which at least one of the plurality of amplifiers is powered by the DC power source and at least one of the plurality of amplifiers receives a signal representative of the sound via its non-inverting input.

A method of audio enhancement comprises the steps of: transmitting audio signals to an enhancement circuit, transmitting enhanced audio signals to a user, and maintaining latency between audio signal transmission and enhanced audio signal transmission below approximately 1.8 ms where 1.8 ms is the expected latency and, for certain other applications where delays are approximately 3.0 ms, below that 3.0 ms threshold.

BRIEF DESCRIPTION OF THE DRAWINGS

FIG. 7A is a schematic of an exemplary embodiment of an audio enhancement system and circuit.

FIG. 7B is a schematic of an exemplary embodiment of a modification circuit to be used with the system of FIG. 7A.

FIG. 7C is a schematic of an exemplary embodiment of a power control circuit to be used with the system of FIG. 7A.

Figure 1:
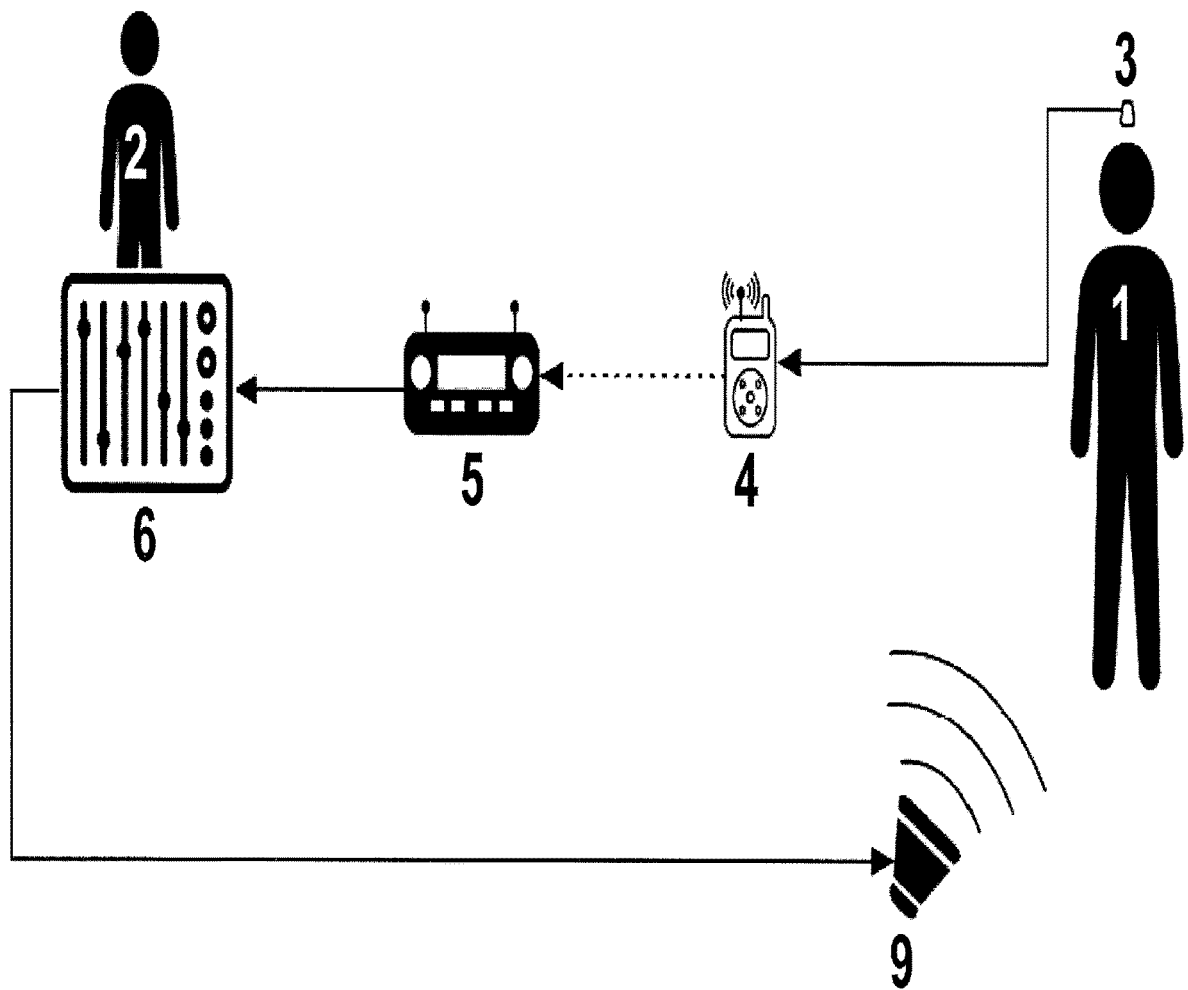
FIG. 1 is an exemplary embodiment of a prior art system involving full analog signal path from user to loud speakers.
Figure 2:
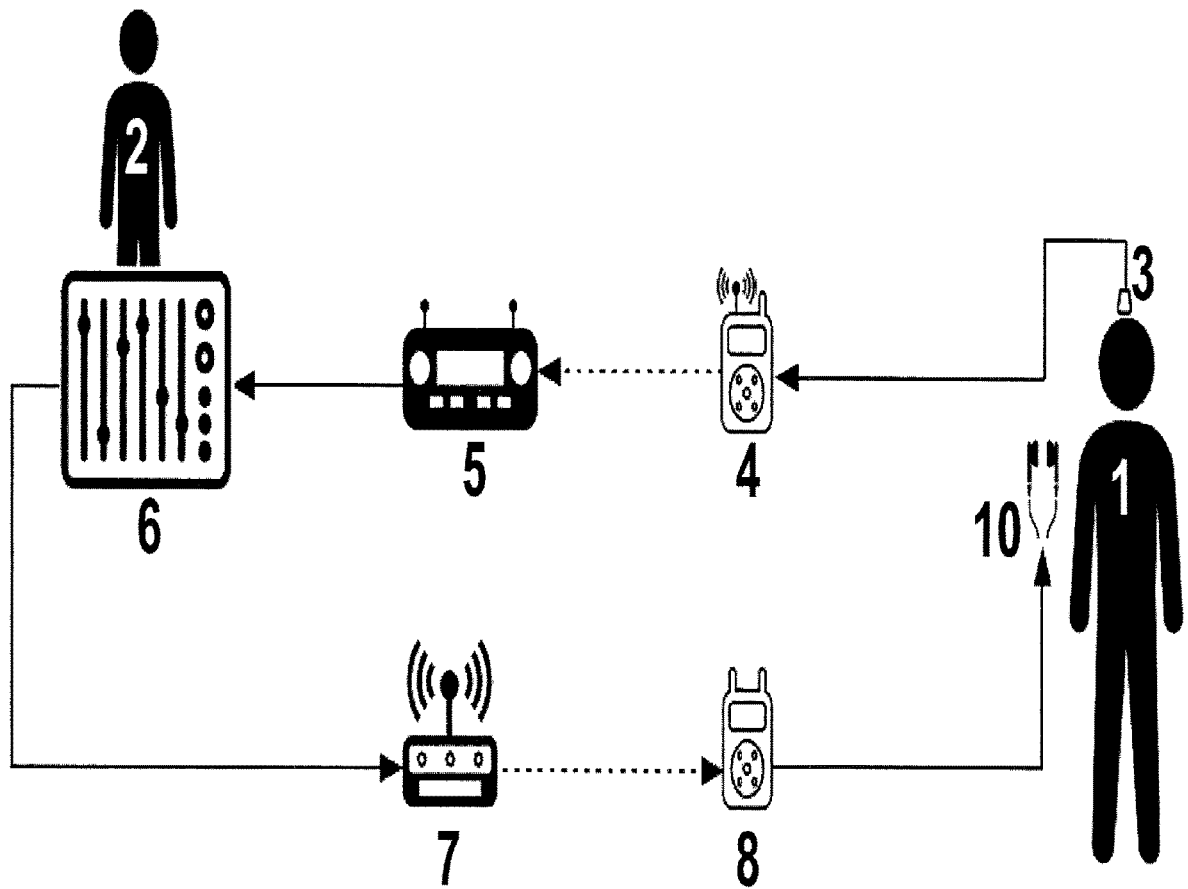
FIG. 2 is an exemplary embodiment of a prior art system involving an analog IEM and analog monitor console.

In the drawings like characters of reference indicate corresponding parts in the different FIGURES. The drawing FIGURES, elements and other depictions should be understood as being interchangeable and may be combined, modified, and/or optimized in any like manner in accordance with the disclosures and objectives recited herein as would be understood to those skilled in the art.

DETAILED DESCRIPTION

In an exemplary embodiment of the invention, a circuit may be employed to eliminate all latency in the system by amplifying the sound signal and returning it directly to the performer's ears entirely in the analog domain. Consequently, signal degradation may be substantially eliminated and the need for additional equipment—analog or digital—is obviated. A further benefit according to this exemplary embodiment is the removal of any additional monitor/controller 2 from the system.

Figure 6:
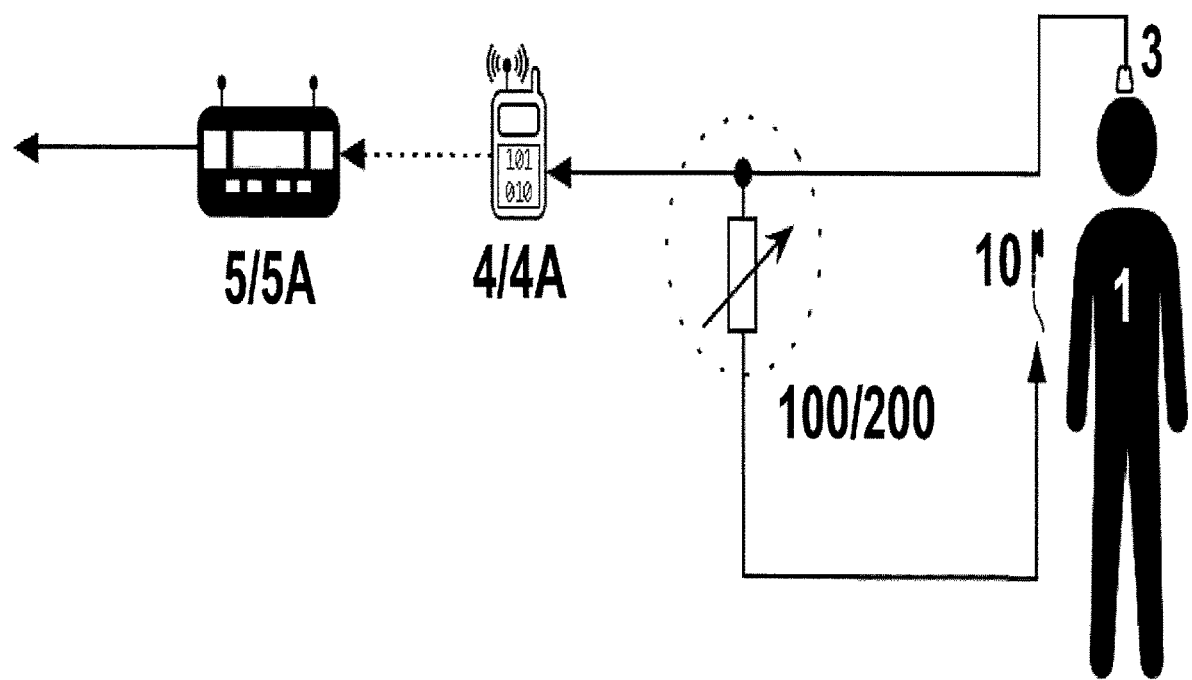
FIG. 6 is an exemplary embodiment of an audio enhancement system using circuit direct monitoring.

Referring to the illustrative embodiment of FIG. 6, the sound source 1 may use a sound input mechanism 3 to transmit sound to an analog/digital transmitter 4/4A to be received by an analog/digital receiver 5/5A. Before transmission to analog/digital transmitter 4/4A, the signal is received by a sound enhancement circuit, which may be exemplified by one or more of the embodiments related to or describing such an enhancement circuit 100, enhancement circuit 200, or their combinations and/or equivalents in terms of architecture, components, or device specifications. A signal that is processed via an audio enhancement circuit 100/200 may then be communicated back to the source 1 via sound transmission means 10, which may include an earphone, headset, or like technology known to those skilled in the art.

Figure 8A:
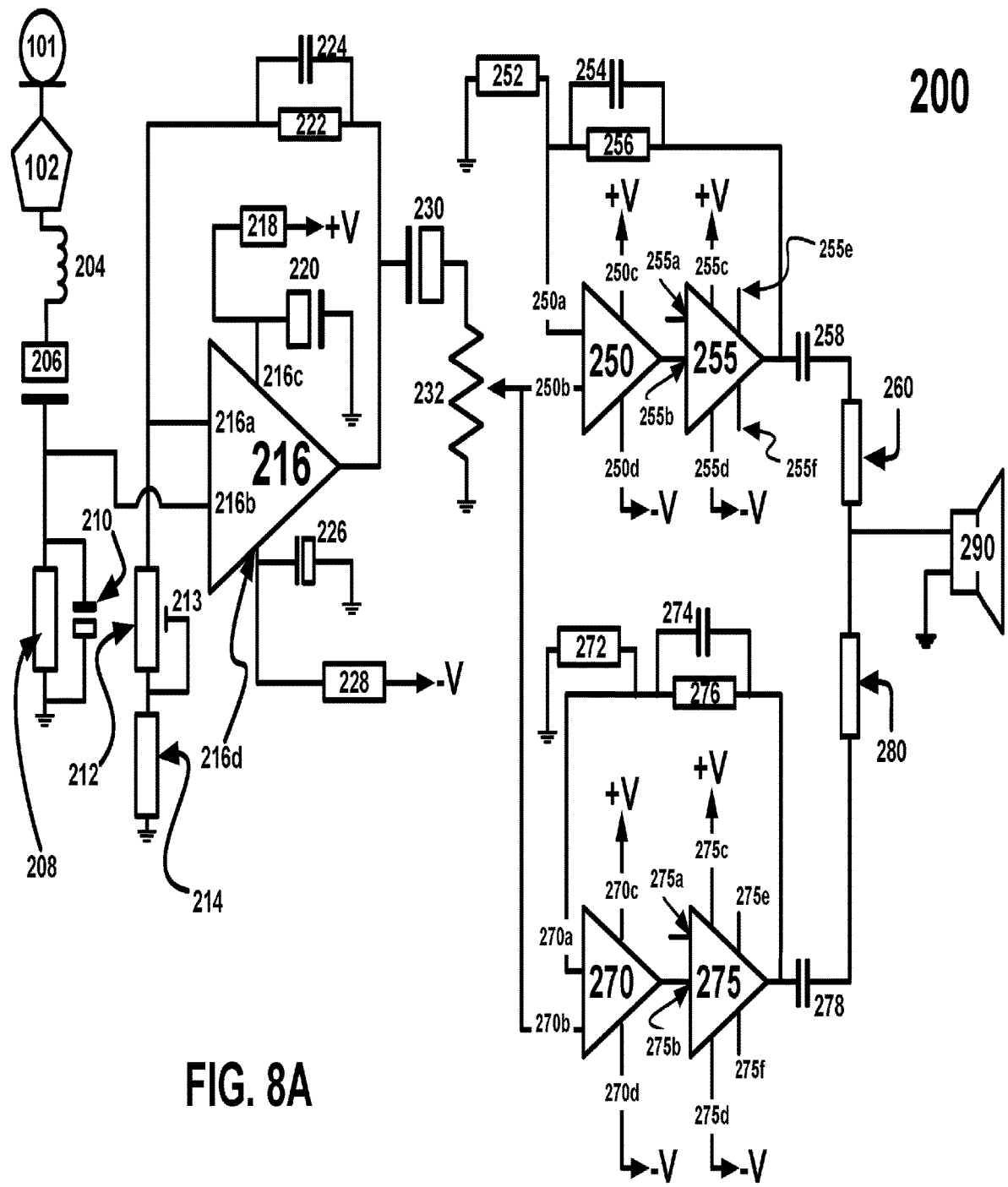
FIG. 8A is a schematic of an exemplary embodiment of another audio enhancement system and circuit.

Referring to the illustrative embodiments of FIGS. 7A and 8A, the exemplary audio enhancement system used in the system exemplified by FIG. 6 may comprise an audio enhancement system 100 or 200A, which may comprise one or more circuits that take sound received from a receiver 101, such as, for example, a microphone, and transmit the sound received through a transmitter 102. An exemplary microphone 101 may be wearable via a clip, snap, adhesive, or other form of mechanical or chemical coupling mechanism known to those skilled in the art. An exemplary transmitter 102 may be of the type made and sold by Sennheiser electronic GmbH & Co. KG, of Wademark, Germany, Shure, Incorporated of Niles, Illinois, United States of America, Samsung Electronics, of Seoul, South Korea, and others known to those skilled in the art.

With reference to the circuit in system 100 depicted in the illustrative embodiment of FIG. 7A, an exemplary microphone 101 receives a sound which is transmitted to transmitter 102. Thereafter, transmitter 102 communicates the signal to capacitive circuit element 104, which is used for DC decoupling and low frequency limiting. A resistive circuit element 106 is connected as illustrated between circuit element 104 and ground so as to set input impedance and further reduce residual DC from the signal sent from the transmitter 102. The remaining signal enters the non-inverting pin 118B of operational amplifier 112.

Feedback signals from amplifier 112, via the pin at 118A, may traverse resistive circuit element 120, which may be found in parallel with a capacitor 124. In this exemplary combination and configuration of components, the capacitor 124 may serve to dampen high frequencies.

Any gain achieved by amplifier 112 may be trimmed by resistive circuit elements 108/109. The total gain of amplifier 112 may be limited by resistive circuit element 110. In an exemplary embodiment the gain trimmer 108/109 may set the gain of the operational amplifier from 0 to +40 dB.

The operational amplifier 112 may receive DC power (from source 160 illustrated in FIG. 7B, which may be, for example, a battery) at positive pin entry 112c and negative pin entry 112d. Resistive circuit elements 114 and 122 may act as decouplers for the positive and negative power supplies, respectively. Capacitive circuit elements 116 and 118 may lessen the noise from the DC power supply 160.

The output of operational amplifier 112 passes through capacitive circuit element 126 to variable resistive element 128. As illustrated, element 126 may act as a decoupling capacitor through which the signal from the operational amplifier 112 passes and enters the variable resistive element 128, which may be, for example a volume control for the signal.

Upon receipt at variable resistive element 128, the signal previously received may pass to the non-inverting input of operational amplifier 130. Inputs 130a and 130b of amplifier 130 have no charge, while a feedback loop is established by way of path 131. Resistive circuit element 132 acts to limit the maximum current of the signal output to the sound communication device 136, which may be, for example, an earphone or ear bud. Capacitive element 134 may also provide for DC blocking and/or decoupling and may also reduce unwanted signal effects that may be damaging to the communication device 136.

In a preferred embodiment, the relative values of each of the aforementioned circuit elements or their preferred implementations in an exemplary system 100 circuit may be provided in Table 1 below:

TABLE 1

| FIG. 7A Circuit Element | Approximate Value For Preferred Embodiment |
| --- | --- |
| 104 | 10 µF with 10% tolerance |
| 106 | 220 kΩ with 1% tolerance |
| 108 | 100 kΩ with 1% tolerance |
| 110 | 1 kΩ with 1% tolerance |
| 112 | NE5532 Operational Amplifier |
| 114 | 2 Ω with 1% tolerance |
| 116 | 22 µF with 10% tolerance |
| 118 | 22 µF with 10% tolerance |
| 120 | 100 kΩ with 1% tolerance |
| 122 | 2 Ω with 1% tolerance |
| 124 | 100 pF with 10% tolerance |
| 126 | 10 µF with 20% tolerance |
| 128 | 10 kΩ with 1% tolerance |
| 130 | NE5532 Operational Amplifier |
| 132 | 16 Ω with 1% tolerance |
| 134 | 10 µF with 10% tolerance |

A person of ordinary skill in the art would be able to substitute, modify, or design equivalents for any of the circuit components identified in system 100 circuit and further elaborated upon in Table 1 so as to provide substantially the same and/or comparable circuit component characteristics, such as, for example, equivalent resistance/induction/capacitance/impedance and/or current/voltage/power or other operational limitations.

With reference to the modification circuit 180 depicted in the illustrative embodiment of FIG. 7B, the circuit 180 may only be utilized when the voltage supply to the circuit of enhancement system 100 of FIG. 7A is above a predetermined value. For example, where switched-capacitor voltage converter 150 may be an ICL7660CSA, circuit 180 may only function, e.g., provide a low voltage at pin 150*a*, when voltages above 5V are supplied, but may be connected to ground for voltages below 3.5V (e.g., low voltage operation). When operational due to an achieved threshold supply voltage, circuit 180 comprises the switched-capacitor voltage converter 150 having multiple pins for various potential operations involving system 100 and power circuit 190 in FIGS. 7A and 7C, respectively.

According to the illustrative embodiment of FIG. 7B, pin 150*b* may connect to a positive terminal of a charge-pump/reservoir capacitor 156, while pin 150*c* may connect to the negative terminal of that same capacitor and/or may be connected to ground. Pin 150*e* may be connected to an external oscillator control input, such as, for example, a capacitor, whereby the input may reduce oscillator frequency. The capacitive circuit elements 152 and 154 may serve as further DC blocking/decoupling capacitors to lessen noise on the negative voltage line from pin 150*d*.

According to the illustrative embodiment of FIG. 7C, an exemplary power circuit 190 for use with the circuits in system 100 and/or with circuit 180, either alone or in combination, may be shown. Circuit 190 may comprise the power source 160 for the circuit 100 and modification circuit 180. A switch 162 may take any form known to persons of ordinary skill in the art. Fuse circuit element 164, which may be, for example, a resettable poly fuse, may work in conjunction with diode 166, to provide for reverse bias protection against the positive DC voltage from the power source 160. As would be understood to a person of ordinary skill in the art, capacitive circuit elements 170 and 168 help to lessen audio frequencies on the DC input line from the power source 160.

As further illustrated in the illustrative embodiment of FIG. 7C, a switched-capacitor voltage converters 172 may comprise a first pin 178A, which may be unconnected (e.g., be a designated "no connection"), a second pin 178B, which may be the positive voltage input and substrate connection, and a third pin 172*c* which may be the connection to ground.

In a preferred embodiment, the switched-capacitor voltage converter 150 and/or switched-capacitor voltage converter 172 of FIGS. 7B and 7C, respectively, may be an ICL7660CSA type regulator offered by Mouser Electronics of Mansfield, Texas. Further, capacitive circuit elements 152, 154, and 156 may be 100 nanoFarads, 22 microFarads, and 10 microFarads, respectively. Capacitive circuit elements 168 and 170 may also be 100 nanoFarads and 100 microFarads, respectively. Power source 160 may also be a 9V battery.

Figure 9:
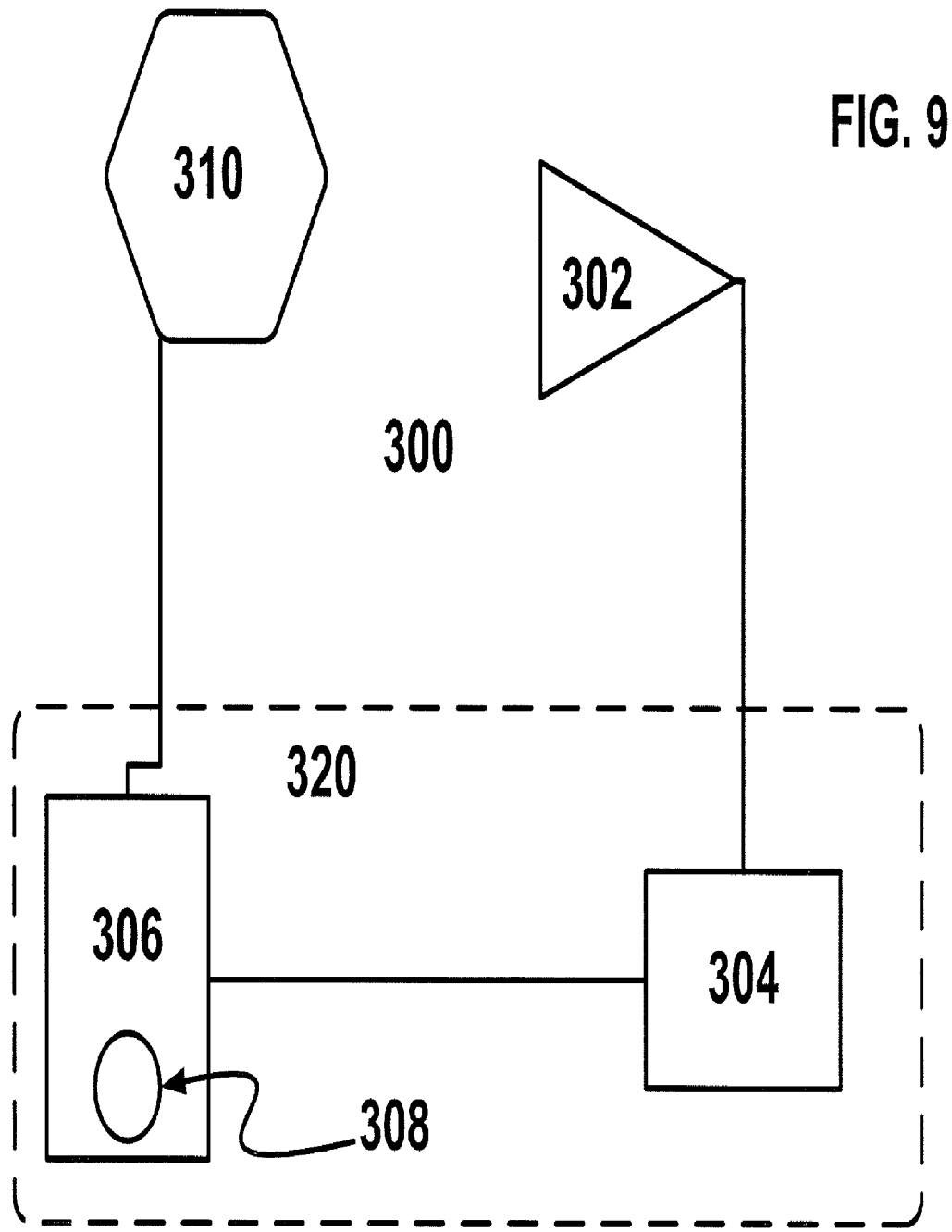
FIG. 9 is an exemplary block diagram of a device that may be used as a stand-alone adaptor or modification unit or be combined with a transmitter to enhance audio.

In combination, the circuit of system 100, circuit 180, and circuit 190 may be used within a device 306, as may be illustrated in FIG. 9, to enhance the sound quality received at receiver 302 and transmitted by transmitter 304. The device 306 can be used as a stand-alone adaptor or modification unit or be combined with the transmitter 304 as an enhancer-transmitter 320. The device 306 may provide for adjustment mechanisms known to those skilled in the art, e.g., dial 308, that may assist in delivering an enhanced sound to the communicator 310. In an exemplary embodiment, use of device 306 in the sound system may allow the user of a wearable audio receiver 302 to obtain the same and/or enhanced audio on a wearable communicator 310 without the need for off-site audio processor equipment or personnel. Accordingly, device 306 and/or enhancer-transmitter 320 may reduce the need for further processing systems used to control audio quality of what is to be delivered by the communicator 310. Those skilled in the art may recognize that enhancer-transmitter 320 may be designed so as to contain all sound receiving and sound communicating technologies in the system.

With reference to the enhancement circuit 200 depicted in the illustrative embodiment of FIG. 8A, an exemplary received sound signal from receiver 101 is transmitted via transmitter 102 to inductive circuit element 204 and capacitive circuit element 206. Inductive circuit element 205 may aid in blocking RF frequencies while capacitive circuit element 206 may be used for DC decoupling and low frequency limiting. Resistive circuit element 208 may be used to set input impedance and/or bleed off residual DC voltage. The capacitive circuit element 210 may be used to complete the RF blockage in conjunction with the inductive circuit element 204.

As an exemplary signal continues through circuit 200, it may enter non-inverting pin 216*b* of operational amplifier 216, which may be, for example, a low noise and stabile operational amplifier known to those skilled in the art. Similar to circuit 100, a resistive circuit element 222 may act as a feedback resistor, which in combination with capacitive circuit element 224, may contribute to high frequency roll off. Similar to circuit 100, a resistive circuit element 212 may act as a gain trimmer, which in a preferred embodiment, may set the gain of operational amplifier 216 from approximately 0 dB to approximately +40 dB. Likewise, resistive circuit element 214 may limit the total gain for amplifier 216. Similar to the configuration of resistive circuit elements 114 and 122 in the illustrative circuit 100 depicted in FIG. 7A, resistive circuit elements 218 and 228 may also act as decouplers for the positive and negative DC power supplies. In similar regard, capacitive circuit elements 220 and 226 may also lessen noise on the DC supply lines. As illustrated and aside from inverter and feedback pins, and the negative and positive voltage supplies, no further connections to operational amplifier 216 may be required to allow an exemplary circuit 200 to function in accordance with one or more of the objectives disclosed.

Further in the progression of a signal through circuit 200, capacitive circuit element 230 may comprise a decoupling capacitor through which the signal passes to reach the variable resistive element 232, which may, for example, be a front panel volume control and/or volume control wiper. An exemplary signal may pass from the variable resistive element 232 to the non-inverting inputs 250*b* and 270*b* of operational amplifiers 250 and 270, respectively. One or both of operational amplifiers 250 and 270 may be a dual low noise operational amplifier known to those skilled in the art.

In an exemplary circuit 200, the feedback loop for either of operational amplifiers 250 and 270 may comprise a current driver amplifier 255 and 275, respectively. In a preferred embodiment, one or more of current driver amplifiers 255 and 275 may be a DRv134 operational amplifier known to those skilled in the art. The output/driver stages and/or the gain for current driver amplifier 255 may be set by a combination of resistive circuit elements 252 and 256. The output/driver stages and/or the gain for current driver amplifier 275 may be set by a combination of resistive circuit elements 272 and 276. In a preferred embodiment, the output of the operational amplifier network formed by the operational amplifier 250/270 and its corresponding driver amplifier 255/275 may be increased by approximately 23 dB for a given stage. Capacitive circuit elements 254 and 274 may also roll off high frequencies in the operational amplifier network previously described.

In the exemplary circuit 200, pins 250c and 250d may be positive and negative voltage supply regions, respectively, for operational amplifier 250. Similarly, pins 270c and 270d may be positive and negative voltage supply regions, respectively, for operational amplifier 270. Each of these operational amplifier's pins 250a and 270a, respectively, may serve as the conduits for the current driver amplifier feedback loop previously discussed. However, in contrast, the current driver amplifiers 255 and 275 do not have any connection at their input pins 255a and 275a but only receive the signal from operational amplifiers 250 and 270 via their non-inverting pins 255b and 275b, respectively. Further, each of the current driver amplifiers 255 and 275 has a positive voltage supply pin 255c and 275c, respectively, and a negative voltage supply pin 255d and 275d, respectively.

As previously disclosed with respect to an exemplary circuit 100, a DC blocking and/or decoupling function may be achieved at both ends of the amplifier networks using, for example, a capacitive circuit element 258/278 to provide protection to the sound communication equipment, which may be, for example, ear phones 290/291.

Fuse devices 260 and 280 may also be incorporated into the design of an exemplary circuit 200 to provide further limits on maximum current of the signal that may reach the communication equipment. Fuse devices 260/280 may be resettable after occurrence of a fault. In an exemplary embodiment, an audio signal traversing circuit 200 may be routed to an eight inch/3.5 mm jack, whereby two communication devices may each be driven by the same power source but using separate current driving amplifiers.

In a preferred embodiment, the relative values of each of the aforementioned circuit elements or their preferred implementations in an exemplary circuit 200 may be provided in Table 2 below:

TABLE 2

| FIG. 8A/11 Circuit Element | Approximate Value For Preferred Embodiment |
| --- | --- |
| 204 | 1 mH with 10% variance |
| 206 | 22 µF with 10%-20% variance |
| 208 | 220 kΩ with 1% variance |
| 210 | 1 nF with 5% variance |
| 212 | 10 kΩ with 1% variance |
| 214 | 100 Ω with 1% variance |
| 216 | NE5532 Dual Low-Noise High-Speed Audio Operational Amplifier, such as that supplied by Texas Instruments of Dallas, Texas. |
| 218 | 2 Ω with 1% variance |
| 220 | 22 µF with 10%-20% variance |
| 222 | 2 Ω with 1% variance |
| 224 | 100 pF with 5% variance |
| 226 | 22 µF with 10%-20% variance |
| 228 | 2 Ω with 1% variance |
| 230 | 10 µF bipolar with 10%-20% variance |
| 232 | 10 kΩ with 1% variance |
| 250 | NE5532 Dual Low-Noise High-Speed Audio Operational Amplifier |

TABLE 2-continued

| FIG. 8A/11 Circuit Element | Approximate Value For Preferred Embodiment |
| --- | --- |
| 252 | 330Ω with 1% variance |
| 254 | 22 pF with 5% variance |
| 255 | BUF634 Operational Amplifier, such as that supplied by Texas Instruments of Dallas, Texas. |
| 256 | 4.7 kΩ with 1% variance |
| 258 | 330 µF with 10%-20% variance |
| 260 | Poly 0.2 Amps |
| 270 | NE5532 Dual Low-Noise High-Speed Audio Operational Amplifier |
| 272 | 330Ω with 1% variance |
| 274 | 22 pF with 5% variance |
| 275 | BUF634 Operational Amplifier, such as that supplied by Texas Instruments of Dallas, Texas. |
| 276 | 4.7 kΩ with 1% variance |
| 278 | 330 µF with 10%-20% variance |
| 280 | Poly 0.2 Amps |

A person of ordinary skill in the art would be able to substitute, modify, or design equivalents for any of the circuit components identified in circuit 200 and further elaborated upon in Table 2 so as to provide substantially the same and/or comparable circuit component characteristics, such as, for example, equivalent resistance/induction/capacitance/impedance and/or current/voltage/power or other operational limitations.

Figure 3:
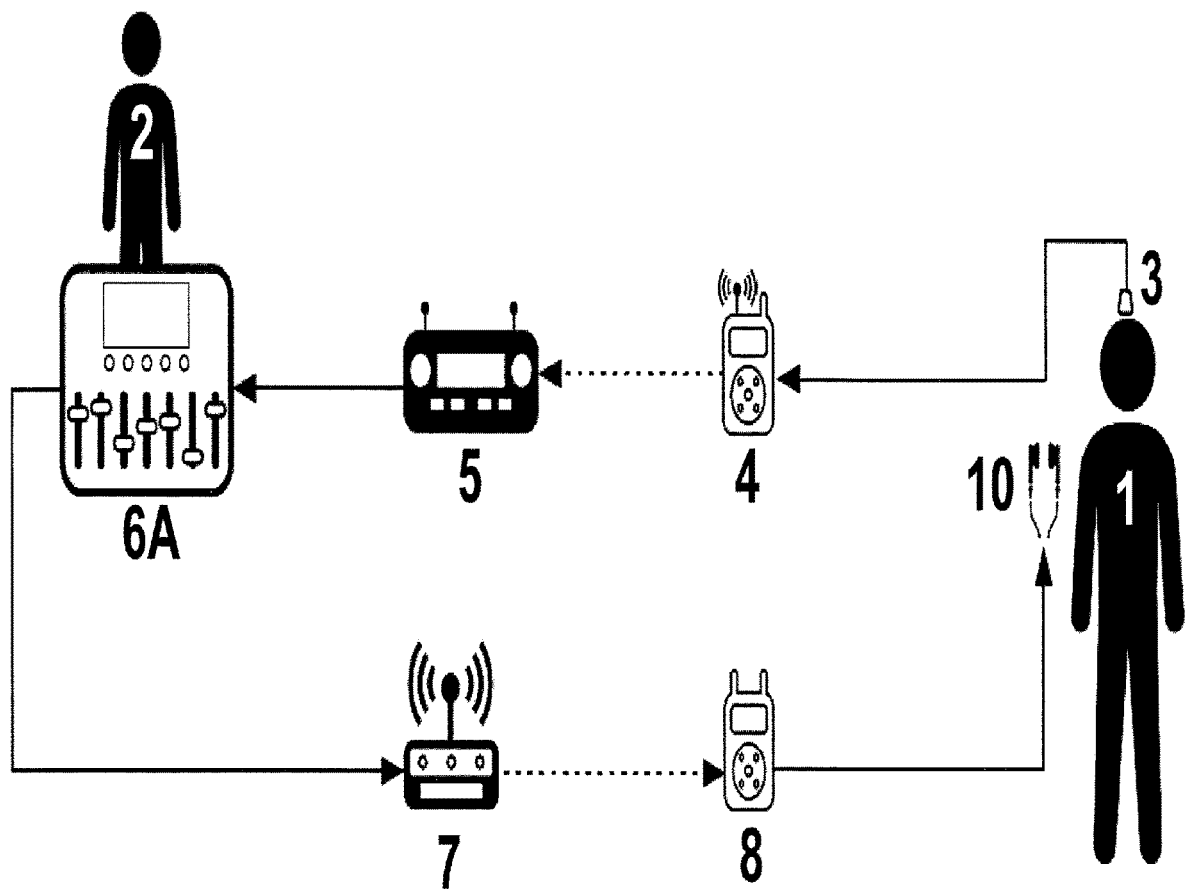
FIG. 3 is an exemplary embodiment of a prior art system involving an analog IEM and a digital monitor console.
Figure 4:
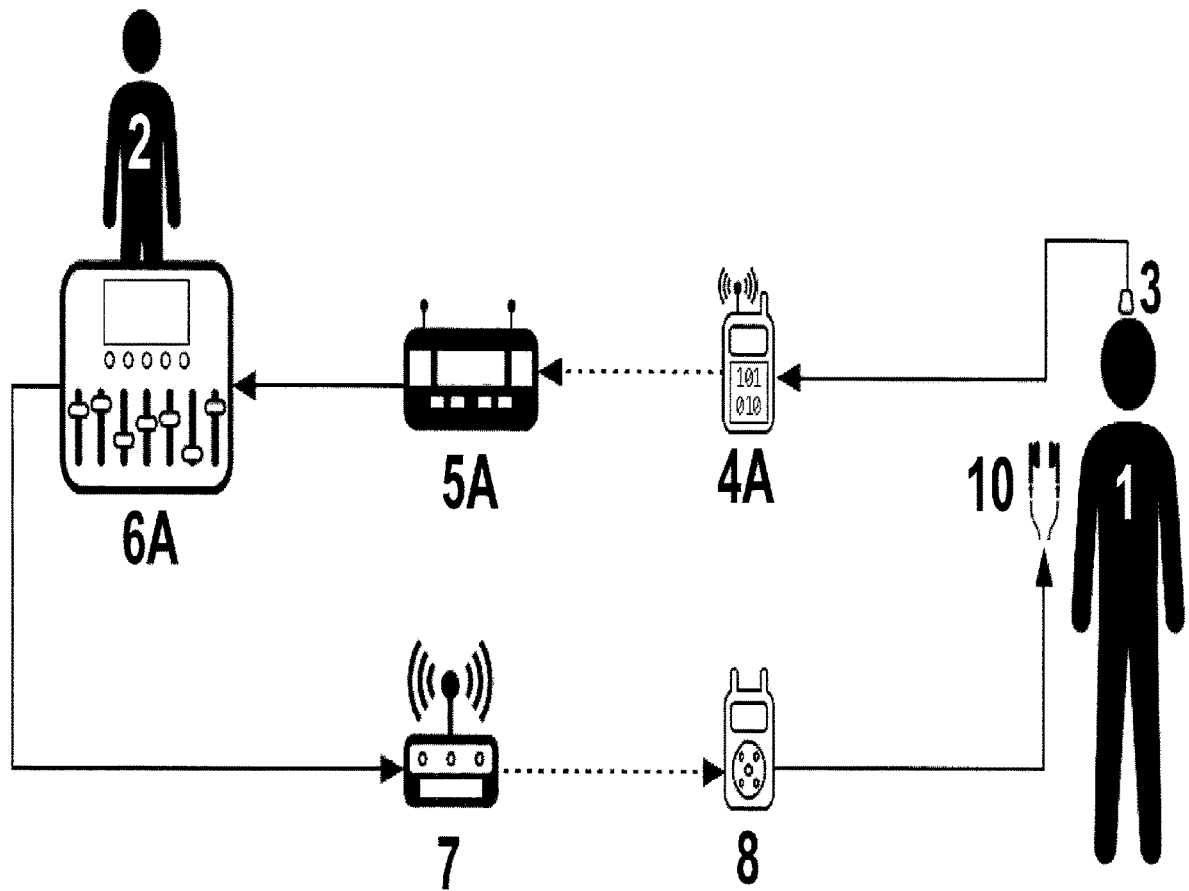
FIG. 4 is an exemplary embodiment of a prior art system involving a digital wireless system and a digital monitor console.
Figure 5:
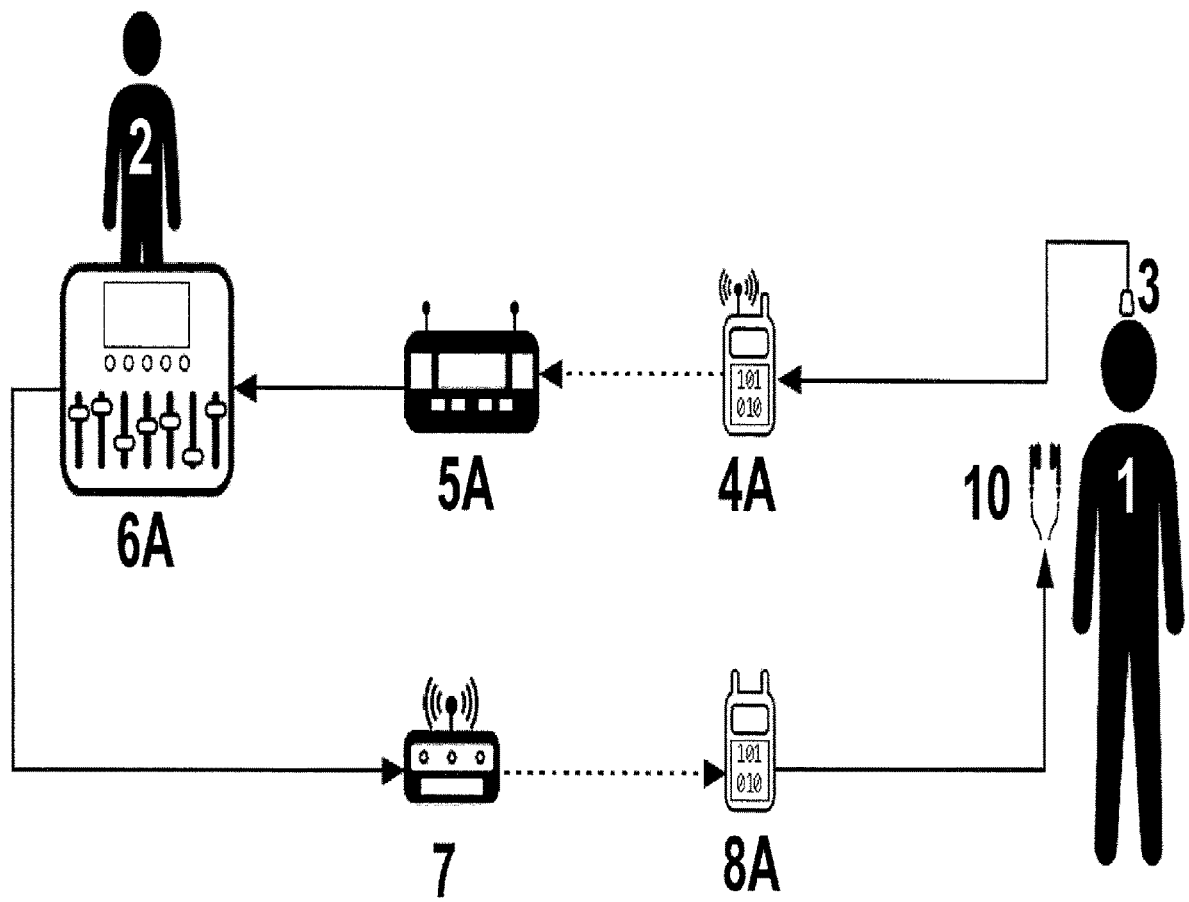
FIG. 5 is an exemplary embodiment of a prior art system involving a digital wireless IEM, digital wireless transmitted, and a digital monitor console.

With reference to the illustrative embodiment of FIG. 7B, an exemplary power circuit 200 may have a power source 240, such as a lithium 9V type battery, which may be 7.5 to 8 volts when charged, may have its minus terminal attached to ground and its plus terminal to switch 242. Switch 242 may take the form of a lever-and-hinge construct or may be a rotational section of a knob or dial (e.g., dial 308 as illustrated in FIG. 3). In an exemplary embodiment, the knob that may control volume on the device housing circuit 200A may also be part of the switch 242 mechanism for circuit 200A. The positive DC voltage goes through a fuse element 246, which may be a resettable polyfuse, to diode element 248, which may be a reverse bias protection part of circuit 200A. Capacitive circuit elements 262 and 264 may aid in reducing audio frequencies on the DC voltage input line.

The positive voltage enters linear voltage regulator 266 at input 266a. In an exemplary embodiment, the voltage going to regulator 266 is approximately 7 Volts and the regulator is a linear +5 volt regulator. To protect the regulator 266, a diode element 268 may be situated at output 266c. Each of capacitive circuit elements 282, 284, and 286 may act to filter DC voltage, stabilize the DC voltage signal, or a combination thereof.

The voltage that enters a DC conversion device 288, which may be a DC-DC SM device, such as the kind offered by Mouser Electronics of Mansfield, Texas. Device 288 may convert the incoming voltage to another voltage, for example a positive 5 V DC to a positive and/or negative 9 V DC. As depicted, device 288 uses pins 288b and 288c as ground to which regulator 266 output pin 266b may also be connected. Input pin 288a may receive the output voltage from regulator 266, while output pins 288d and 288e may provide positive and negative DC voltage to power the amplifiers 650, 655, 670, 675 in circuit 200.

Figure 8B:
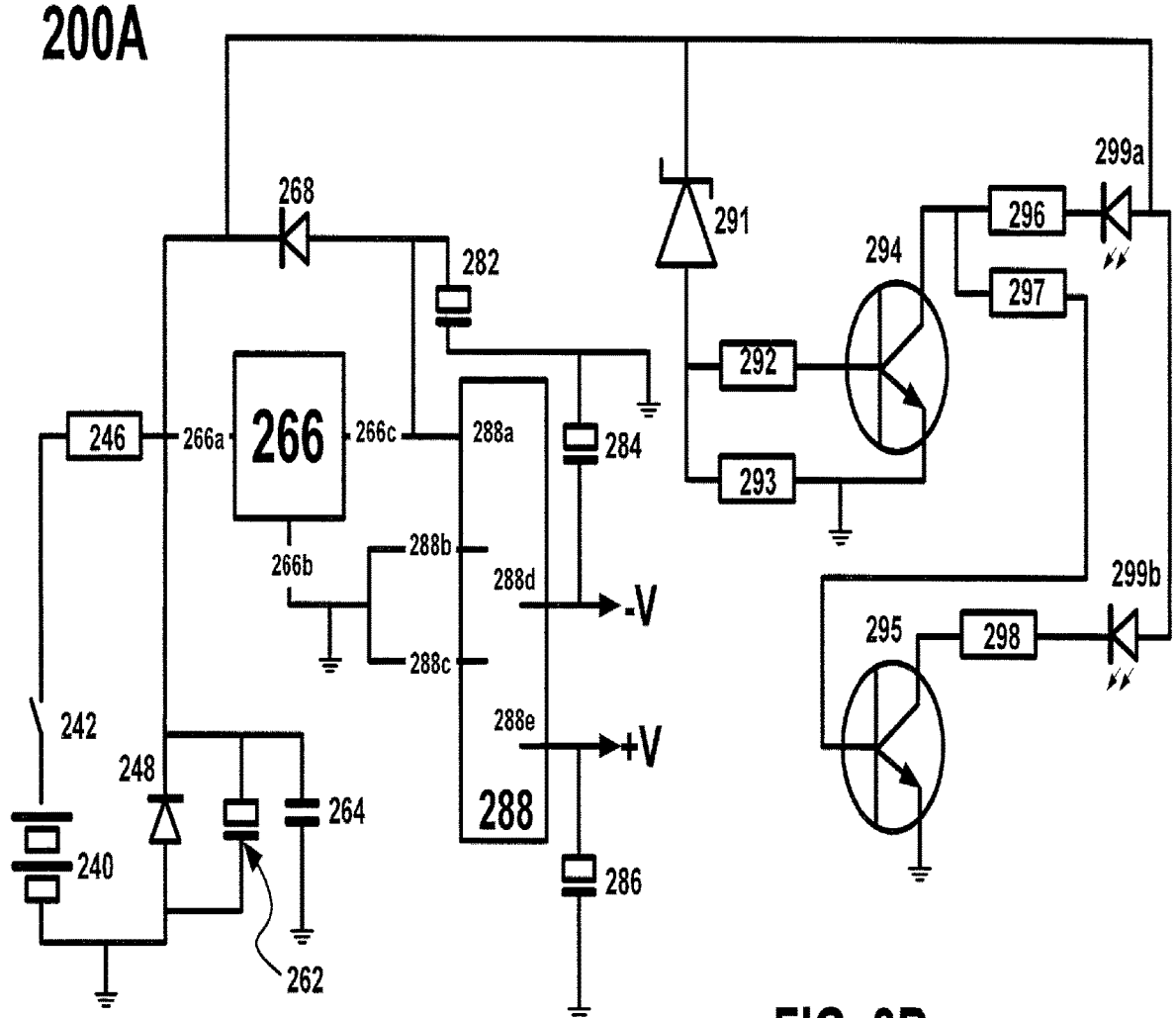
FIG. 8B is a schematic of an exemplary embodiment of a power control circuit to be used with the system of FIG. 8A.

Input 266a of regulator 266 may also be connected to Zener diode element 291 specified to a particular DC voltage. In a preferred embodiment, Zener diode element may be specified as 5.1V DC. Upon passing Zener diode 291, the DC voltage may pass through resistive element 292 to the base of an NPN transistor 294 and pass through resistive element 293. In an exemplary embodiment, NPN transistor 294 may act as a switch while the resistive element 293 bleeds off the DC voltage to ground, which is to where NPN transistor 294 emitter is coupled. The collector of NPN transistor 294 may be connected to resistive elements 296 and 297, which make for a signaling arrangement with LED 299a to indicate when power is applied and nominal voltage is satisfactory. As illustrated in FIG. 8B, resistive element 296 may be coupled to the cathode of LED 299a, while the positive voltage of the power source 240 may be connected to the anode of LED 299a.

The voltage traveling through resistive element 297 may also enter the base of NPN transistor 295, which may also act as a switch. The emitter of the NPN transistor 295 may be coupled to ground while the collector connects to resistive element 298, which like resistive element 296, may further limit the current. Simultaneously, resistive element 298 may be connected to the cathode of with LED 299b and the positive voltage of the power source 240 may be connected to the anode of LED 299b. Accordingly, if the power source 240 may have a voltage below a predetermined threshold, one of LED 299a or 299b may alight. Lighting of one or LED 299a or 299b may indicate replacement of or further need for additions to the power source 240.

In an exemplary embodiment, the power source 240 may still allow for the system to work if the voltage remains above a certain threshold. In a preferred embodiment, an exemplary system using a circuit such as 200 and 200A may utilize a lithium battery to charge the system so long as the battery voltage is above approximately 4.7V. In an exemplary embodiment, the time between recharge events for the particular circuits of 200 and 200A may be approximately 5 hours.

In a preferred embodiment, the relative values of each of the aforementioned circuit elements or their preferred implementations in an exemplary circuit 200A may be provided in Table 3 below:

TABLE 3

| FIG. 8B Circuit Element | Approximate Value For Preferred Embodiment |
|---|---|
| 240 | 7 volts |
| 246 | Polyfuse 0.65 Amps |
| 248 | Fairchild MMSD4148 |
| 262 | 22 µF with 10%-20% variance |
| 264 | 100 pF with 5% variance |
| 266 | 7805 5 V, 1.5 A Linear Voltage Regulator |
| 268 | Fairchild MMSD4148 |
| 282 | 22 µF with 10%-20% variance |
| 284 | 22 µF with 10%-20% variance |
| 286 | 22 µF with 10%-20% variance |
| 288 | DC-DC SM 1 Watt Isolated DC-DC converter by Murata Manufacturing Co., Ltd, of Westborough, Massachusetts |
| 291 | 5 volts |
| 292 | 47 kΩ with 1% tolerance |
| 293 | 10 kΩ with 1% tolerance |
| 294 | NPN Transistor - Nexperia 2PD602ASL 215 |
| 295 | NPN Transistor - Nexperia 2PD602ASL 215 |
| 296 | 1 kΩ with 1% tolerance |
| 297 | 47 kΩ with 1% tolerance |
| 298 | 1 kΩ with 1% tolerance |
| 299a | Standard LED (green) |
| 299b | Standard LED (red) |

A person of ordinary skill in the art would be able to substitute, modify, or design equivalents for any of the circuit components identified in circuit 200A and further elaborated upon in Table 2 so as to provide substantially the same and/or comparable circuit component characteristics, such as, for example, equivalent resistance/induction/capacitance/impedance and/or current/voltage/power or other operational limitations.

In an exemplary embodiment, the power sources 160/240 of the systems 100/200 and their corresponding circuits 180, 190, and 200A, respectively, may be combined with or shared with the transmitter, receiver, and/or the communicator. For example, the same battery used to keep charged the transmitter may also be used to keep an exemplary audio enhancement circuit alive. Additionally, exemplary enhancement circuits, like those illustratively provided by the circuits 100/200, and any suitable communicator, receiver, and transmitter may be housed in a single device to reduce space needs. In a preferred embodiment, an enhancement circuit, like those illustratively provided in system 100/200, may be utilized in one or more of the following: mobile communication devices (cell phones, iPhone, personal data assistants), hearing aids/assist, microphone and speaker systems for telecommunications, online gaming, and military applications, and in computer systems configured to allow for online communications between users via platforms such as Face-Time, Webinars, Skype chats, and other variants as known to those skilled in the art.

In a preferred embodiment, the disclosed systems and devices may be utilized as part of an in-ear monitoring system used in theatrical performances by thespians. In such an embodiment, the audio enhancement system may be attached inconspicuously to the wearer while the headphone is elsewhere hidden but otherwise connected to the audio enhancement system. After the user speaks into the microphone during the performance the transmitter would send the sound through the audio enhancement system to enable the thespian to reduce the need for off-stage treatment of the sound signals received, preserve vocal quality and strength, and encourages natural voice production.

Figure 10:
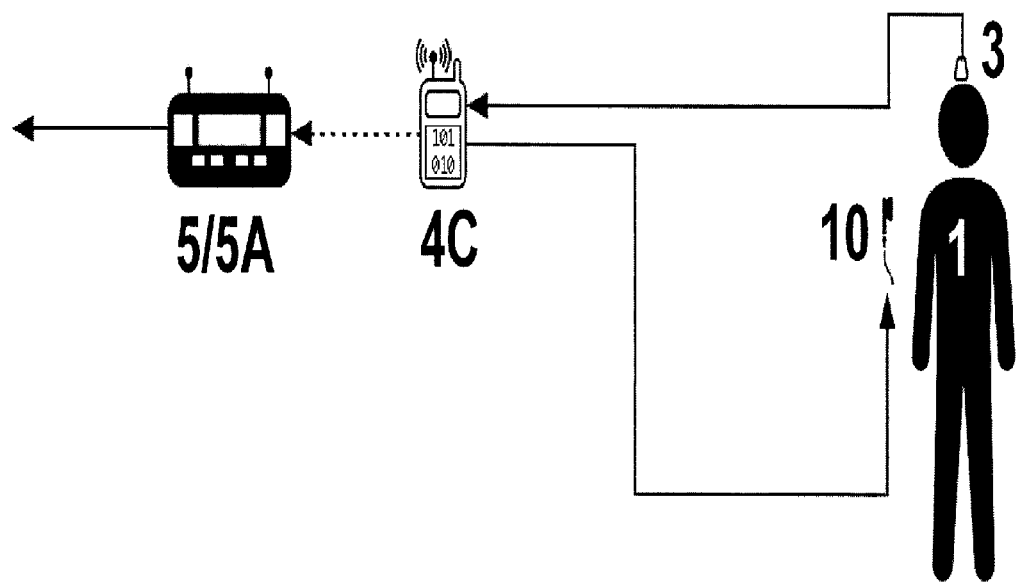
FIG. 10 is another exemplary embodiment of an audio enhancement system wherein the audio enhancement system is integrated with a transmitter.
Figure 11:
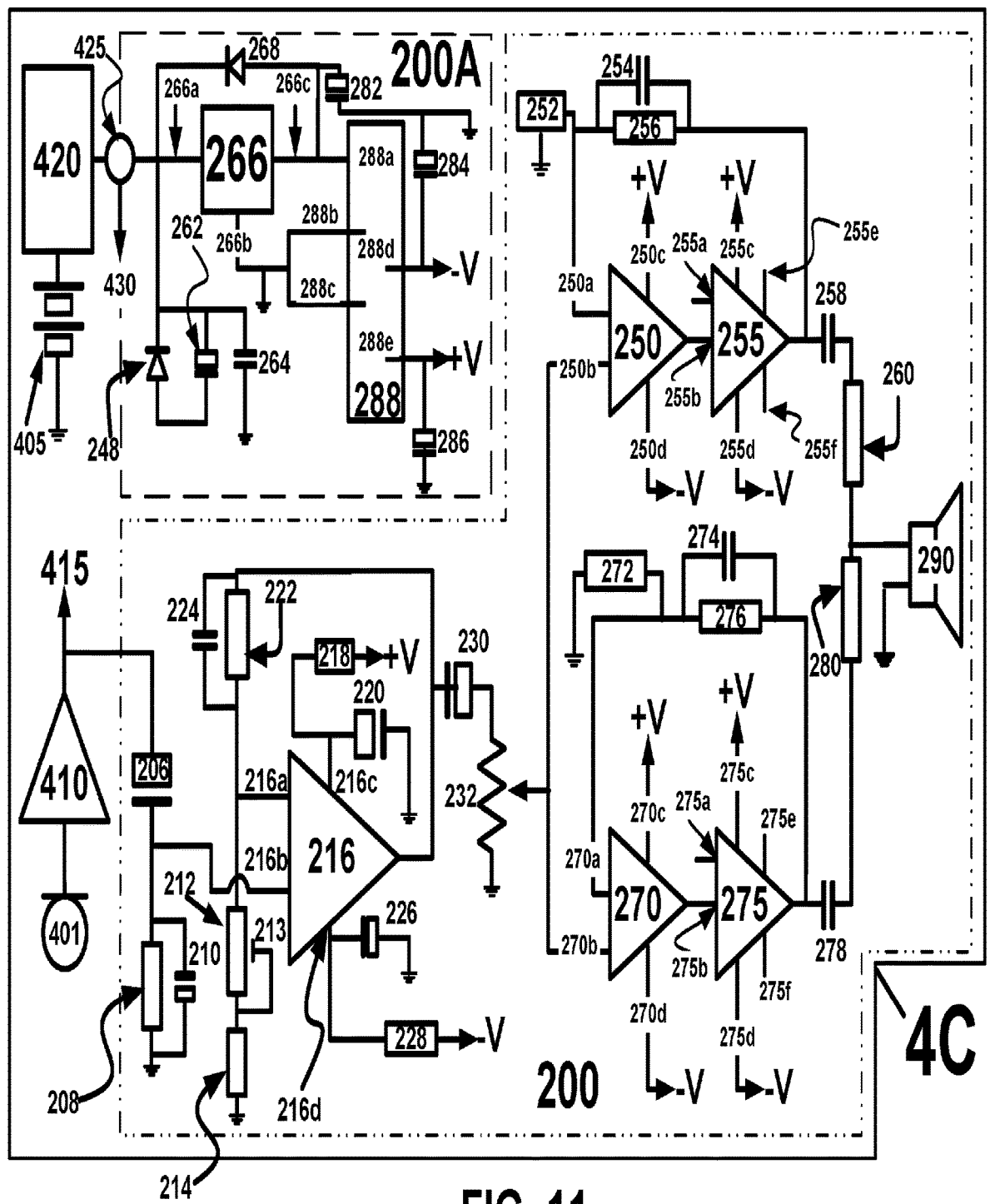
FIG. 11 is a schematic of an exemplary embodiment of a transmitter integrating an audio enhancement system power control circuit therein.

In another alternative embodiment, an exemplary audio enhancement system 100 and/or 200, such as those systems illustratively provided in FIGS. 7A, 7B, 7C, 8A and/or 8B, may be integrated into a pre-existing circuit architecture for an audio transmitting device, including being embedded as an integrated circuit, provided the presence of an earphone amplifier as illustratively provided for in FIGS. 10 and 11.

In the exemplary embodiment of an exemplary audio enhancement system embedded in audio transmitting device illustratively provided for in FIG. 10, the sound source 1 may use a sound input mechanism 3 to transmit sound to an analog/digital or analog/analog transmitter with embedded audio enhancement system therein (collectively, enhanced transmitter 4C). The sound is then transmitted from the transmitter 4C to an analog/digital receiver 5/5A. According to this illustrative embodiment, the transmitter 4C provides local output for monitoring, which has the benefit of providing an exemplary zero latency (e.g., 1-2 microseconds) between microphone 3 and sound source 1. Consequently, no monitor engineer or console is required for sound source 1 to control the quality and character of the sound input into mechanism 3.

In the exemplary embodiment of an exemplary audio enhancement system embedded in audio transmitting device illustratively provided for in FIG. 11, exemplary components of audio enhancement systems 200 and 200A, as illustratively provided for in FIGS. 8A and 8B, respectively, and described herein, may be embedded in an transmitter 4C. In contrast to the audio enhancement systems of FIGS. 8A and 8B, transmitter 4C contains its own microphone 401, battery and/or power source 405, microphone amplifier 410, DC/DC converter 420, and control switch 425. According to this exemplary embodiment illustrated in FIG. 11, microphone 401 belonging to transmitter 4C may take in sound signals for amplification by microphone amplifier 410. In an exemplary embodiment, microphone amplifier 410 may be a constituent a wireless or RF transmitter. The power source 405 may be used to power the other components in the audio enhancement systems 200 and 200A, such as, for example microphone amplifier 410, regulator 266, and device 288. In the portion of transmitter 4C proximal to microphone 401, the audio output of microphone amplifier 410 may be fed into enhancement circuit system 200 as well as to other components via line 415 (e.g., the audio stage of a transmitter such as a Sennheiser SK50 Wireless Transmitter).

In another exemplary embodiment of transmitter 4C, a control switch 425 may be a hardware switch or a software-controlled switch that can either activate or inactivate enhancement circuit system 200 and/or 200A. In an exemplary embodiment, control switch 425 may be designed to reduce energy consumption by one or more components in enhancement circuit systems 200, 200A, or a combination of both and/or combination of components in each, e.g., power consumption by device 288 and amplifiers 216/250/255/270/275. In a further exemplary embodiment of transmitter 4C, power from power source 405, e.g. a battery, may also be used to power other components via line 430 of transmitter 4C, such as, for example, microphone amplifier 410, system 200, the RF and audio sections of the transmitter 4C. According to the foregoing exemplary embodiments, the transmitter portion of enhanced transmitter 4C may be a Sennheiser SK50 transmitter sold and made by Sennheiser Electronic GmbH & Co. KG, of Wademark, Germany or other commercially available transmitters known to those skilled in the art.

This present invention disclosure and exemplary embodiments are meant for the purpose of illustration and description. The invention is not intended to be limited to the details shown. Rather, various modifications in the illustrative and descriptive details, and embodiments may be made by someone skilled in the art. These modifications may be made in the details within the scope and range of equivalents of the claims without departing from the scope and spirit of the several interrelated embodiments of the present invention.

What is claimed is:

1. An audio enhancement circuit for enhancing an audio signal from a source, comprising:
    a plurality of first amplifiers interconnected to one another by a plurality of circuit components, wherein each first amplifier in the plurality of first amplifiers is disposed within a feedback loop having a portion of the feedback loop connecting to the first amplifier via the non-inverting input of the individual amplifier and at least one second amplifier is directly coupled to a variable resister via its non-inverting input;
    wherein the audio signal travels through at least one feedback loop and at least one first amplifier.
2. The audio enhancement circuit of claim 1, further comprising a gain trimmer.
3. The audio enhancement circuit of claim 1, further comprising at least one second amplifier coupled to another amplifier via an inverting input of the at least one second amplifier.
4. The audio enhancement circuit of claim 1, further comprising at least one second amplifier coupled to an inverting input of another amplifier and coupled to a variable resister via the non-inverting input of the at least one second amplifier.
5. The audio enhancement circuit of claim 1, further comprising a third amplifier interconnected to at least one of the plurality of first amplifiers and the at least one second amplifier.
6. The audio enhancement circuit of claim 3, further comprising a third amplifier interconnected to at least one of the plurality of first amplifiers and the at least one second amplifier.
7. The audio enhancement circuit of claim 4, further comprising a third amplifier interconnected to at least one of the plurality of first amplifiers and the at least one second amplifier.
8. The audio enhancement circuit of claim 5, further comprising a third amplifier interconnected to at least one of the plurality of first amplifiers and the at least one second amplifier.
9. An audio transmitter, comprising:
    a microphone and an enhancement circuit, wherein the enhancement circuit comprises:
        a power circuit comprising at least one DC voltage conversion element; and
        a plurality of amplifiers, wherein at least one of the plurality of amplifiers is powered by a DC voltage, at least one of the plurality of amplifiers receives at least one signal representative of a sound received through the audio transmitting device via a feedback loop coupled at a non-inverting input of at least one of the plurality of amplifiers, and a second plurality of amplifiers with a feedback loop coupled at a non-inverting input of at least one of the second plurality of amplifiers.
10. The audio transmitter of claim 9, wherein the system has at least three amplifiers.
11. The audio transmitter of claim 10, wherein the feedback loop includes at least one of the plurality of amplifiers.
12. The audio transmitter of claim 9, wherein the enhancement circuit is coupled to a receiver via a wireless connection.
13. The audio transmitter of claim 12, further comprising a headset that transmits an enhanced version of the signal representative of the sound from the enhancement circuit.
14. The audio transmitter of claim 9, further comprising a headset that transmits an enhanced version of the signal representative of the sound from the enhancement circuit.
15. The audio transmitter of claim 9, wherein the audio transmitter is coupled to a source of the sound.
16. The audio transmitter of claim 9, wherein the audio transmitter and a headset are each coupled to a source of the sound.
17. The audio transmitter of claim 9, wherein the audio transmitter and a headset are each coupled to a source of the sound and wirelessly connected to a receiver.
18. A method of enhancing a sound from a source via a wearable transmitter, the method comprising:
    coupling the wearable transmitter to the source of the sound, wherein the wearable transmitter comprises the audio enhancement circuit of claim 1;
    transmitting a signal representative of the sound from the source through the audio enhancement circuit of claim 1; and
    receiving, at a receiver, an enhanced version of the sound from the source following passage of the signal representative of the sound through the audio enhancement circuit of claim 1 with substantially zero latency.
19. A method of enhancing a sound from a source via the audio transmitter of claim 9, the method comprising:
    coupling the audio transmitter to the source of the sound;

transmitting a signal representative of the sound from the source through the audio transmitter; and receiving an enhanced version of the sound from the source with substantially zero latency.

\* \* \* \* \*